United States Patent [19]

McLeod

[11] 4,392,105

[45] Jul. 5, 1983

[54] TEST CIRCUIT FOR DELAY MEASUREMENTS ON A LSI CHIP

[75] Inventor: Mark H. McLeod, Poughkeepsie, N.Y.

[73] Assignee: International Business Machines Corp., Armonk, N.Y.

[21] Appl. No.: 217,373

[22] Filed: Dec. 17, 1980

[51] Int. Cl.³ .................... G01R 17/02; G01R 29/02; G01R 31/28
[52] U.S. Cl. ........................... 324/57 DE; 324/73 R; 331/46; 331/57; 331/DIG. 3; 340/653
[58] Field of Search ............ 324/57 R, 57 DE, 73 R, 324/73 AT; 340/653, 657, 658; 331/46, 49, 57, DIG. 3; 307/517; 328/129, 130, 162

[56] References Cited

FOREIGN PATENT DOCUMENTS

| 1581865 | 12/1980 | United Kingdom . |
| 506813 | 5/1976 | U.S.S.R. .......................... 324/57 DE |
| 725048 | 3/1980 | U.S.S.R. ............................ 324/73 R |

*Primary Examiner*—Siegfried H. Grimm
*Attorney, Agent, or Firm*—Edward S. Gershuny

[57] ABSTRACT

A test circuit that is particularly suitable for inclusion on an LSI chip when testing a new technology. The circuit will enable accurate determination of the turn-on and turn-off delays of a logic circuit on the chip. Two related feedback loops are provided, one of the loops containing the circuit being tested. The differences in time duration between related portions of the two loops correspond to the turn-on and turn-off delays of the circuit being tested.

6 Claims, 6 Drawing Figures

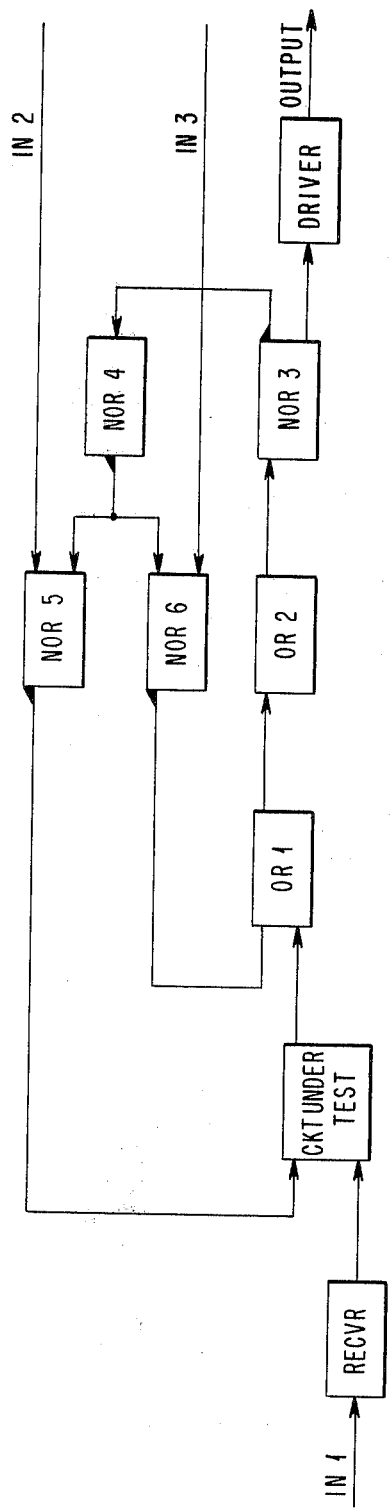
FIG. 1
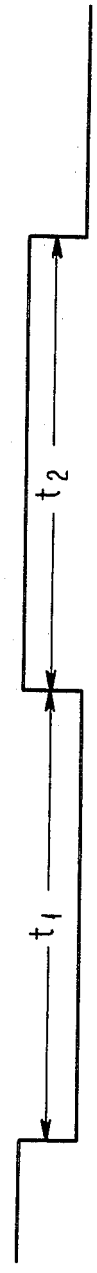
FIG. 2 (OUTER LOOP)
FIG. 3 (INNER LOOP)

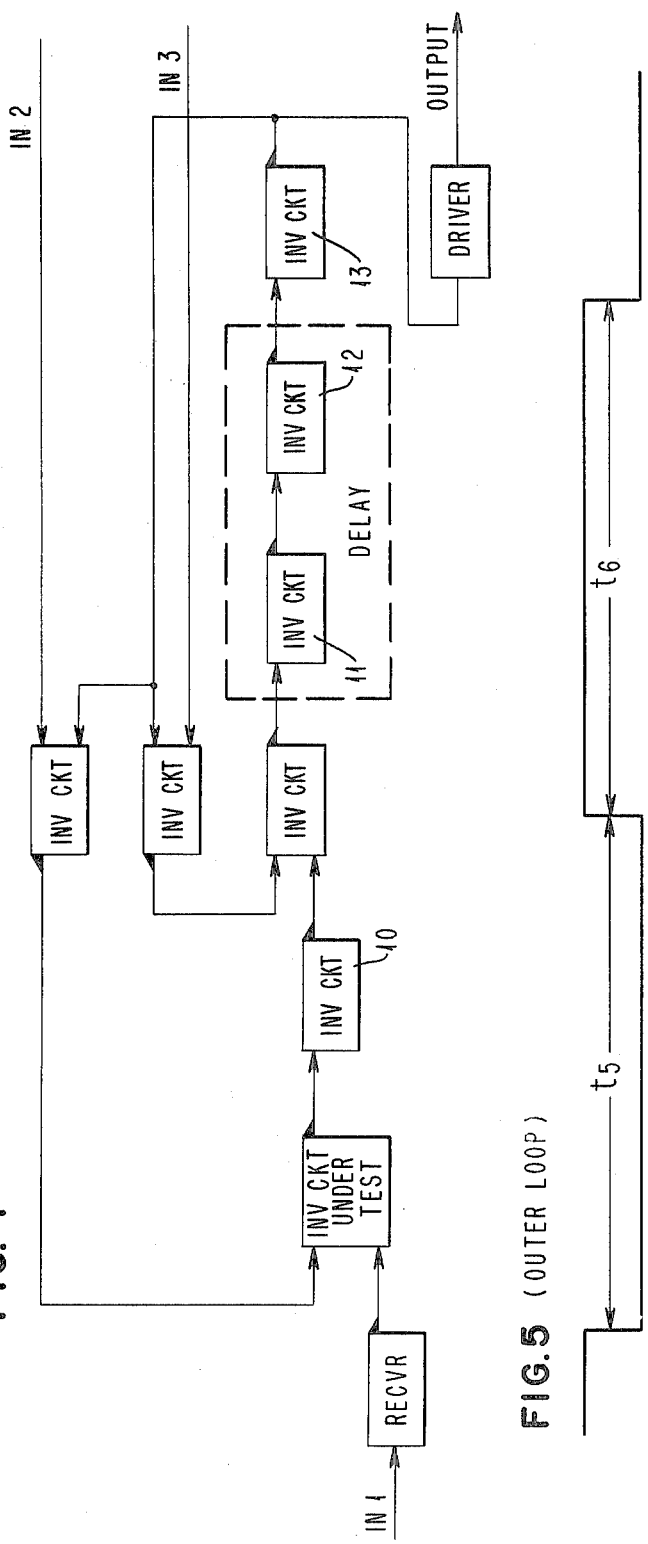

TEST CIRCUIT FOR DELAY MEASUREMENTS ON A LSI CHIP

INTRODUCTION

This invention relates to test sites which are often included on chips made by large scale integration (LSI) techniques when a new technology or a new process is being tested. More particularly, the invention relates to an improved circuit for performing delay measurements on an LSI chip, the improved circuit enabling one to separately measure the turn-on and turn-off delays of a sample circuit on the chip.

When changes are being considered in the manufacture of LSI chips, the changes and the new chips must be thoroughly tested. One way of testing the changes is to produce sample chips with a variety of circuit structures contained on them. Some of the circuit structures will be test circuits that aid in testing the other structures. One parameter that can be of great significance in determining the value of a new manufacturing technique is the delay introduced by various circuits on the chip. Since an LSI chip may have a very large number of sequential circuits contained on it, lengthy individual delays cannot be tolerated. Of course, the smaller the delay, the faster the circuits, and the faster will be the machine that uses the circuits.

SUMMARY OF THE INVENTION

It is an object of this invention to provide an improved test circuit for measuring circuit delays on an LSI chip.

A more particular object of the invention is to provide an improved circuit which can separately measure the turn-on and turn-off delays of a circuit on a chip.

In accordance with a preferred embodiment of the invention, two related feedback loops, comprising an inner loop and an outer loop, are provided in a logic chain. The signal lengths of the inner and outer loops differ by delays introduced by the circuit that is being tested. Each of the loops is permitted to oscillate and the durations of its down and up signals are measured. The difference in duration between the down signals of the two loops and between the up signals of the two loops correspond to the turn-on delay and the turn-off delay of the circuit being tested.

The primary advantage of this invention is that its use will enable separate measurement of the turn-on and turn-off times of a circuit on an LSI chip.

Another advantage of the invention is that one of these test circuits on a chip can be readily adapted to measure the turn-on and turn-off times of a plurality of other circuits.

BRIEF DESCRIPTION OF THE DRAWINGS

In the accompanying drawings, forming a material part of this disclosure:

FIG. 1 is a diagram of a preferred embodiment of the test circuit;

FIG. 2 is a timing diagram showing the signal produced by oscillations of the outer loop of the circuit of FIG. 1;

FIG. 3 is a timing diagram showing the signal produced by oscillations of the inner loop of FIG. 1;

FIG. 4 shows an alternative embodiment of the invention that may be used for measuring delays introduced by inverting logic;

FIG. 5 is a timing diagram showing the signal produced by oscillations of the outer loop of the circuit shown in FIG. 4;

FIG. 6 is a timing diagram showing the signal produced by oscillations of the inner loop of the circuit of FIG. 4.

DETAILED DESCRIPTION

For further comprehension of the invention, and of the objects and advantages thereof, reference is made to the following description and accompanying drawings, and to the appended claims in which the various novel features of the invention are more particularly set forth.

Referring to FIG. 1, there is shown a schematic diagram of a preferred embodiment of the test circuit of this invention. The test circuit comprises two OR circuits, OR1 and OR 2, and four NOR circuits, NOR 3, NOR 4, NOR 5, and NOR 6. (For reasons to be described below, OR 2 may be replaced in a preferred embodiment by a simple delay circuit.) Also shown in FIG. 1 is an OR circuit (labeled CKT UNDER TEST) that is to be tested, and a receiver RECVR for signals coming in from off the chip and a driver for signals that are to be sent off the chip. (Only the driver and one receiver are shown in the drawing. As will be recognized by those skilled in the art, drivers and receivers will be utilized to whatever extent is desirable, based on the circuitry involved.) In the preferred embodiment, it is important that NOR 5 and NOR 6 be substantially identical.

Operation of the circuit for measurement purposes proceeds as follows. First, inputs IN 1 and IN 2 are set "down" and input IN 3 is set "up". This will result in an oscillation in the loop which comprises CKT UNDER TEST, OR 1, OR 2, NOR 3, NOR 4 and NOR 5, and will produce at the OUTPUT the signal shown in FIG. 2. OUTPUT will remain low during a time $t_1$ during which circuit NOR 3 is receiving a "down" input. As a result of this, NOR 3 will feed an up signal to NOR 4, turning NOR 4 "on" (thus driving its output down). The output of NOR 4 will then turn circuit NOR 5 "off" (causing its output to go "up") which will turn "on" the circuit under test. The positive output of the circuit under test is transmitted through OR 1 (which has its other input held "down" by the output of NOR 6 because IN 3 is "up") and OR 2 to NOR 3, thus causing the OUTPUT line to go "up". Thus, the "down" time $t_1$ shown in FIG. 2 is equal to the turn-on delay of NOR 4 plus the turn-off delay of NOR 5 plus the turn-on delay of CKT UNDER TEST plus the turn-on delay of OR 1 plus the turn-on delay of OR 2 plus the turn-on delay of NOR 3. The "up" time $t_2$ shown in FIG. 2 is equal to the turn-off delay of NOR 4 plus the turn-off delay of NOR 5 plus the turn-off delay of CKT UNDER TEST plus the turn-off delay of OR 1 plus the turn-off delay of NOR 3. (As will be clear to those skilled in the art, OR 2 serves no function other than to introduce an additional delay into the oscillating loops. It is included in the preferred embodiments merely so that the OUTPUT signal will have a period that is long enough to be conveniently measured. OR 2 can be replaced by a delay line or any other circuit which will serve the function of introducing an appropriate delay.)

The other measurement that needs to be taken is with IN 1 and IN 3 both held "down" and IN 2 held "up". This will cause oscillation of an inner loop which comprises NOR 3, NOR 4, NOR 6, OR 1 and OR 2. The signal produced on the OUTPUT line as a result of this oscillation is shown in FIG. 3. The time $t_3$ during which this signal is "down" will be equal to the turn-on delay of NOR 4 plus the turn-off delay of NOR 6 plus the turn-on delay of OR 1 plus the turn-on delay of OR 2 plus the turn-on delay of NOR 3. The duration $t_4$ of the "up" time of the OUTPUT signal will be equal to the turn-off delay of NOR 4 plus the turn-on delay of NOR 6 plus the turn-off delay of OR 1 plus the turn-off delay of OR 2 plus the turn-off delay of NOR 3.

With the arrangement shown, times $t_1$ and $t_3$ differ in two respects: $t_1$ includes the turn-on delay of the circuit under test while $t_3$ does not; and $t_1$ includes the turn-off of NOR 5 while $t_3$ includes the turn-off of NOR 6. All other terms in $t_1$ and $t_3$ are identical. Since in the preferred embodiment, NOR 5 and NOR 6 are constructed to be as identical as possible, we may assume that their turn-off times are substantially identical. With this assumption, it follows that the difference between the two times $t_1$ and $t_3$ is equal to the turn-on delay of the circuit under test. Thus, measuring the times $t_1$ and $t_3$ and determining their difference will determine the turn-on delay of the circuit under test.

Similarly, the "up" times $t_2$ and $t_4$ differ in that: $t_2$ includes the turn-off delay of the circuit under test while $t_4$ does not; and $t_2$ includes the turn-on delay of NOR 5 while $t_4$ includes the turn-on delay of NOR 6. If again, we can assume that the turn-on delays of NOR 5 and NOR 6 are the same, then it follows that the only difference between $t_2$ and $t_4$ is the turn-off delay of the circuit under test. Thus, measuring $t_2$ and $t_4$ and determining their difference will provide a measurement of the turn-off time of the circuit under test.

Although the preferred embodiment of the invention shown in FIG. 1 is a very particular arrangement, those skilled in the art will recognize that various changes can be made. As was discussed above, OR 2 can be replaced by any suitable delay (or even deleted if the delay it introduces is not needed).

As another example, instead of feeding the negative output of NOR 3 to the output driver, the output driver could receive its input from the positive output of NOR 3. (Of course, this would invert the signals shown in FIGS. 2 and 3.)

Actually, OUTPUT could be derived from any convenient point; or even from two different points (preferably, but not necessarily, in phase with each other) for the two loops. If two points were used that were not in phase; one of $t_1$ and $t_3$ would be "up" and the other "down"; and one of $t_2$ and $t_4$ would be "up" and the other "down". Also, if two different points were used, care would need to be taken to ensure that the two drivers had identical delays (or that differing delays were taken into account in measurements). However, for purposes of measuring turn-on and turn-off delays, the relationships between those time periods would still hold.

Irrespective of the above and other changes, the essential aspect of the invention is that it has two measurable loops which produce signals that differ in accordance with the turn-on and turn-off times of a circuit under test.

Those skilled in the art will also recognize that one of these measuring circuits on an LSI chip can be used to measure the turn-on and turn-off delays of a number of circuits to be tested. Of course, if this invention is implemented in such an environment, care will need to be utilized in insuring that the mechanism utilized to select among circuits to be tested does not introduce spurious delays which might add to the turn-on and turn-off times of the circuits being tested. The need for such precautions are well known to those skilled in the art and precise manners in which they may be implemented need not be discussed herein.

The embodiment shown in FIG. 1 will not function properly for a circuit under test which uses inverting logic. In such a situation, the output of the circuit under test would need to be inverted prior to taking the measurements. However, if the circuit under test were simply to be followed by an inverting circuit, then the difference between $t_1$ and $t_3$ would not be only the turn-on delay of the circuit under test but would be the turn-on delay of the circuit under test plus the turn-off delay of the following inverter. Likewise, the difference between $t_2$ and $t_4$ would be the turn-off delay of the circuit under test plus the turn-on delay of the following inverter. Thus, before the turn-on and turn-off delays of the circuit under test could be accurately measured, it would be necessary to know the delays introduced by the following inverter.

An embodiment of the invention that could be used for measuring turn-on and turn-off delays of an inverting logic circuit under test is shown in FIG. 4. The embodiment shown in FIG. 4 consists entirely of inverting logic and could be made up entirely of NOR circuits. Circuits 10, 11, 12, and 13 would then be one-input NOR circuits or, more simply, inverters. When comparing the embodiment of FIG. 4 to the embodiment shown in FIG. 1, those skilled in the art will note that inverters 11 and 12 of FIG. 4 correspond identically to OR 2 of FIG. 1 and are included merely to provide a delay to insure that the signal path is long enough to be conveniently measured.

When inputs IN 1 and IN 2 are held "down" while IN 3 is held "up", the outer loop which includes the inverting circuit under test and inverter 10 will oscillate to produce the waveforms shown in FIG. 5. When inputs IN 1 and IN 3 are held "down" while input IN 2 is held "up" the inner loop, which does not include inverting circuit under test or inverter 10, wll oscillate producing the waveforms shown in FIG. 6. Using an analysis similar to that described above with respect to FIGS. 1, 2 and 3, it can readily be seen that the difference between time periods $t_5$ and $t_7$ is equal to the turn-on time of the inverting circuit under test plus the turn-off time of inverter 10, and the difference between time periods $t_6$ and $t_8$ is equal to the turn-off delay of the inverting circuit under test plus the turn-on delay of inverter 10. If the turn-on and turn-off delays of inverter 10 are known, they can be subtracted from the difference between $t_5$ and $t_7$ and the difference between $t_6$ and $t_8$ to find, respectively, the turn-on time of the inverting circuit under test and the turn-off time of the inverting circuit under test.

Although the invention was illustrated above using OR and NOR circuits, it is not limited to any particular circuit type. For example, the logic could be AND, NAND, or other circuit types while still using the invention.

While I have illustrated and described the preferred embodiments of the invention, it is to be understood that I do not limit myself to the constructions herein disclosed and the right is reserved to all changes and modifications coming within the scope of the invention as defined in the appended claims.

Having thus described my invention, what I claim as new, and desire to secure by Letters Patent is:

1. For use on an LSI chip, a circuit for measuring the turn-on and turn-off delays of a logic circuit on said chip, said measuring circuit comprising:
    a first loop capable of producing a first signal, and containing said logic circuit;
    a second loop capable of producing a second signal, and not containing said logic circuit; and
    means for insuring that a first portion of each of said first and second signals are related to each other in a manner that is dependent upon the turn-on delay of said logic circuit, and that a second portion of each of said first and second signals are related to each other in a manner that is dependent upon the turn-off delay of said logic circuit.

2. The measuring circuit of claim 1 further including:
    delay means common to both of said loops for enhancing the ease of detection of said first and second signals.

3. The measuring circuit of claim 1 or 2 wherein:
    the difference in duration between the first portions of said first and second signals is related to the turn-on delay of said logic circuit, and the difference in duration between the second portions of said first and second signals is related to the turn-off delay of said logic circuit.

4. The measuring circuit of claim 3 wherein said logic circuit is an inverting circuit and said measuring circuit further comprises:
    an additional inverting circuit within said first loop, but not within said second loop.

5. For use on an LSI chip, a circuit for measuring the turn-on and turn-off delays of a logic circuit on said chip, said measuring circuit comprising:
    a first loop capable of oscillation to produce a first periodic signal, and containing said logic circuit;
    a second loop capable of oscillation to produce a second periodic signal, and not containing said logic circuit;
    means for causing oscillation of each of said loops;
    means for insuring that the difference in duration between a first portion of each of said first and second signals is related to the turn-on delay of said logic circuit, and the difference in duration between a second portion of each of said first and second signals is related to the turn-off delay of said logic circuit.

6. The measuring circuit of claim 5 wherein said logic circuit is an inverting circuit and said measuring circuit further comprises:
    an additional inverting circuit within said first loop, but not within said second loop.

* * * * *